United States Patent
Sung et al.

(10) Patent No.: US 8,286,579 B2
(45) Date of Patent: Oct. 16, 2012

(54) MASK ASSEMBLY FOR THIN FILM VAPOR DEPOSITION OF FLAT PANEL DISPLAY

(75) Inventors: Dong-Young Sung, Suwon-si (KR); Hwa-Jeong Kim, Suwon-si (KR)

(73) Assignee: Samsung Display Co., Ltd, Yongin, Gyeonggi-do (KR)

( * ) Notice: Subject to any disclaimer, the term of this patent is extended or adjusted under 35 U.S.C. 154(b) by 569 days.

(21) Appl. No.: 12/196,445

(22) Filed: Aug. 22, 2008

(65) Prior Publication Data
US 2009/0137180 A1 May 28, 2009

(30) Foreign Application Priority Data
Nov. 23, 2007 (KR) .................. 10-2007-0120267

(51) Int. Cl.
*B05C 1/00* (2006.01)
*B05C 5/00* (2006.01)
*B05C 11/11* (2006.01)
*B05B 15/04* (2006.01)
*C23C 16/00* (2006.01)

(52) U.S. Cl. ........ 118/504; 118/213; 118/301; 118/505; 118/720; 118/721

(58) Field of Classification Search .......... 118/300–305, 118/504, 720, 213, 505, 721
See application file for complete search history.

(56) References Cited

U.S. PATENT DOCUMENTS 6,858,086 B2 * 2/2005 Kang ............................. 118/720
6,955,726 B2 10/2005 Kang et al.

FOREIGN PATENT DOCUMENTS

| CN | 1542160 | | 11/2004 |
|---|---|---|---|
| JP | 2004-014513 | A | 1/2004 |
| JP | 2005-310635 | A | 11/2005 |
| JP | 2007-131935 | | 5/2007 |
| KR | 2003-0093959 | | 12/2003 |
| KR | 10-2006-0055942 | A | 5/2006 |
| KR | 10-0687488 | * | 5/2006 |
| KR | 10-2006-0102838 | * | 9/2006 |
| KR | 10-2006-0102838 | A * | 9/2006 |
| KR | 2006-0102838 | | 9/2006 |
| KR | 10-0658762 | | 12/2006 |

OTHER PUBLICATIONS

Translation of KR 10-0687488.*
Translaiton of KR 10-2006-0102838A.*

* cited by examiner

*Primary Examiner* — Dah-Wei Yuan
*Assistant Examiner* — Binu Thomas
(74) *Attorney, Agent, or Firm* — Knobbe, Martens, Olson & Bear LLP

(57) ABSTRACT

A mask assembly for thin film vapor deposition of a flat panel display is disclosed. In the mask assembly, a cleansing solution remaining in the gap between a unit mask and a frame after cleansing the mask assembly may be minimized. The mask assembly includes a frame and a plurality of unit masks. The frame includes a pair of first supporting portions and a pair of second supporting portions that surround an opening. The plurality of unit masks have at least one set of pattern openings, and the unit masks are fixed on the first supporting portion while having a tensile force applied thereto. The first supporting portion includes a first surface and a second surface. The unit masks are fixed on the first surface, and the second surface has a height difference to the first surface along a thickness direction of the unit masks from the first surface.

10 Claims, 5 Drawing Sheets

MASK ASSEMBLY FOR THIN FILM VAPOR DEPOSITION OF FLAT PANEL DISPLAY

CROSS-REFERENCE TO RELATED APPLICATION

This application claims priority to and the benefit of Korean Patent Application No. 10-2007-0120267 filed in the Korean Intellectual Property Office on Nov. 23, 2007, the entire content of which is incorporated herein by reference.

BACKGROUND OF THE INVENTION

1. Field of the Invention

The present invention relates to a mask assembly for thin film vapor deposition of a flat panel display. More particularly, the present invention relates to a frame in which a plurality of tensile unit masks are fixed and supported and a mask assembly is formed.

2. Description of the Related Technology

Recently, flat panel displays have been popular as they are small in depth and light in weight to solve problems of a cathode ray tube. Examples of flat panel displays include an organic light emitting diode (OLED) display, a liquid crystal display (LCD), and a plasma display panel (PDP).

Generally, an electrode and an emission layer are formed using predetermined patterns so as to manufacture a flat panel display (e.g., an OLED display). A vapor deposition method using a mask assembly may be used to form the electrode and the emission layer.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect of the present invention is a mask assembly for vapor depositing a thin film of a flat panel display, in which a cleansing solution remaining in a gap between unit masks and a frame after cleansing the mask assembly is minimized and protrusions and depressions are prevented from being formed on the unit masks to increase vapor deposition accuracy and minimize vapor deposition error.

Another aspect of the present invention is a mask assembly for vapor-depositing a thin film of a flat panel display which includes a frame and a plurality of unit masks. The frame includes a pair of first supporting portions and a pair of second supporting portions that surround an opening. The plurality of unit masks have at least one set of pattern openings, and the unit masks are fixed on the first supporting portion while having a tensile force applied thereto. The first supporting portion includes a first surface and a second surface. The unit masks are fixed on the first surface. The second surface has a height difference to the first surface along a thickness direction of the unit masks from the first surface.

The first surface may be closer to the opening than the second surface, and the second surface may have a height that is lower than that of the first surface. A thickness of the first surface of the first supporting portion may be greater than that of the second surface of the first supporting portion. An opposite surface of the first and second surfaces in the first supporting portion may be formed to be planar.

The first surface may have the same height as that of the second supporting portion. The first supporting portion may satisfy an equation of $0.2 \leqq W2/W1 \leqq 0.4$, where $W1$ denotes a width of the first supporting portion and $W2$ denotes a width of the first surface.

Another aspect of the invention is a mask assembly for thin film vapor deposition of a flat panel display, the mask assembly comprising: i) a frame comprising a pair of first supporting portions and a pair of second supporting portions, wherein the two pairs are connected to each other so that an inner perimeter of the connected pairs defines an opening and ii) a plurality of unit masks having at least one set of pattern openings, wherein the unit masks are fixed to the first supporting portion while having a tensile force applied thereto, wherein the plurality of unit masks have a length and a thickness, and wherein the first supporting portion comprises: a) a first sub-section connected to a portion of the unit masks, wherein the first sub-section overlaps with the unit mask portion when viewed from the direction of the thickness of the unit masks, and wherein the first sub-section has a first height measured along the thickness direction, and b) a second sub-section extending from the first sub-section along the direction of the length of the unit masks, wherein the second sub-section is not connected to the unit masks and does not overlap with the unit masks when viewed from the thickness direction, and wherein the second sub-section has a second height different from the first height.

In the above mask assembly, the first sub-section may be closer to the opening than the second sub-section. In the above mask assembly, the first height may be greater than the second height. In the above mask assembly, each of the first and second sub-sections comprises upper and lower surfaces opposing each other, the upper surface of the first sub-section may be connected to the mask portion, and the lower surfaces of the first and second sub-sections together may form a substantially flat surface.

In the above mask assembly, the first sub-section may have substantially the same height as that of the second supporting portions. In the above mask assembly, the first supporting portion may satisfy an equation of about $0.2 \leqq W2/W1 \leqq$ about $0.4$, wherein $W1$ denotes the width of the first supporting portions and $W2$ denotes the width of the first sub-section.

In the above mask assembly, the frame may be configured to receive, through the opening, an organic material evaporated from a vapor deposition source. In the above mask assembly, the first sub-section may be welded to the masks.

In the above mask assembly, the first sub-section has a first length measured along the length direction of the unit masks, wherein the second sub-section has a second length measured along the length direction, and wherein the second length may be greater than the first length.

Another aspect of the invention is a mask assembly for thin film vapor deposition of a flat panel display, the mask assembly comprising: i) a plurality of unit masks having at least one set of pattern openings and ii) a frame comprising a first pair of side portions and a second pair of side portions, wherein the first and second pairs are connected to each other so that an inner perimeter of the connected pairs defines an opening, and wherein: a) the two pairs of side portions are configured to support the plurality of unit masks, b) a majority portion of the unit masks is exposed through the opening of the frame, c) each of the first pair of side portions comprises first and second sub-sections having different thicknesses from each other, wherein the second sub-section extends from the first sub-section, d) the first sub-section is connected to a portion of the unit masks and overlaps with the mask portion when viewed from the direction of the thickness of the unit masks and e) the second sub-section is not connected to the unit masks and does not overlap with the unit masks when viewed from the thickness direction.

In the above mask assembly, the thickness of the first sub-section may be greater than that of the second sub-section. In the above mask assembly, the thickness difference may be within about a several millimeter range.

In the above mask assembly, the first sub-section has a first length measured along the length direction of the unit masks, wherein the second sub-section has a second length measured along the length direction, and wherein the second length may be greater than the first length. In the above mask assembly, the frame may be configured to receive, through the opening, an organic material evaporated from a vapor deposition source.

In the above mask assembly, the ratio of W2/W1 may be determined based at least in part upon required vapor deposition accuracy, wherein W1 represents the width of the first side portions and W2 represents the width of the first sub-section. In the above mask assembly, the ratio may be in the range from about 0.2 to about 0.4.

DETAILED DESCRIPTION OF CERTAIN INVENTIVE EMBODIMENTS

A typical mask assembly includes a frame having an opening, and band-shaped unit masks are fixed on the frame substantially in parallel while having tensile characteristics along a length direction. The unit masks are welded to the frame, and an upper surface of the frame has a plane surface.

Each unit mask includes a plurality of sets of pattern openings so that a plurality of OLED displays may be formed on a mother substrate. One set of pattern openings corresponds to one display device, and the shape of each pattern opening is substantially the same as that of a plurality of electrodes or a plurality of emission layers that are formed in the display device.

When a vapor deposition process is performed for a predetermined time by using the mask assembly, an organic material is vapor-deposited on the unit masks and the frame. Therefore, after the organic material is eliminated by cleansing it, the mask assembly is vapor-deposited again. The cleansing of the mask assembly is performed by using a cleansing solution, eliminating the organic material from the mask assembly, and drying the mask assembly.

However, the cleansing solution can flow into the gap between the unit masks and the frame during the cleansing process, and the cleansing solution remains after the mask assembly is dried. Since organic materials are included in the cleansing solution, protrusions and depressions may be formed on a surface of the unit mask by the remaining cleansing solution.

In this situation, an adhesive characteristic between the unit masks and the mother substrate is reduced by the protrusions and depressions on the unit mask when the mother substrate is disposed on the unit masks to perform the vapor deposition. Therefore, vapor deposition accuracy may be reduced, and the cleansing solution may leak from the protrusions and depressions on the mother substrate to cause a vapor deposition error.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
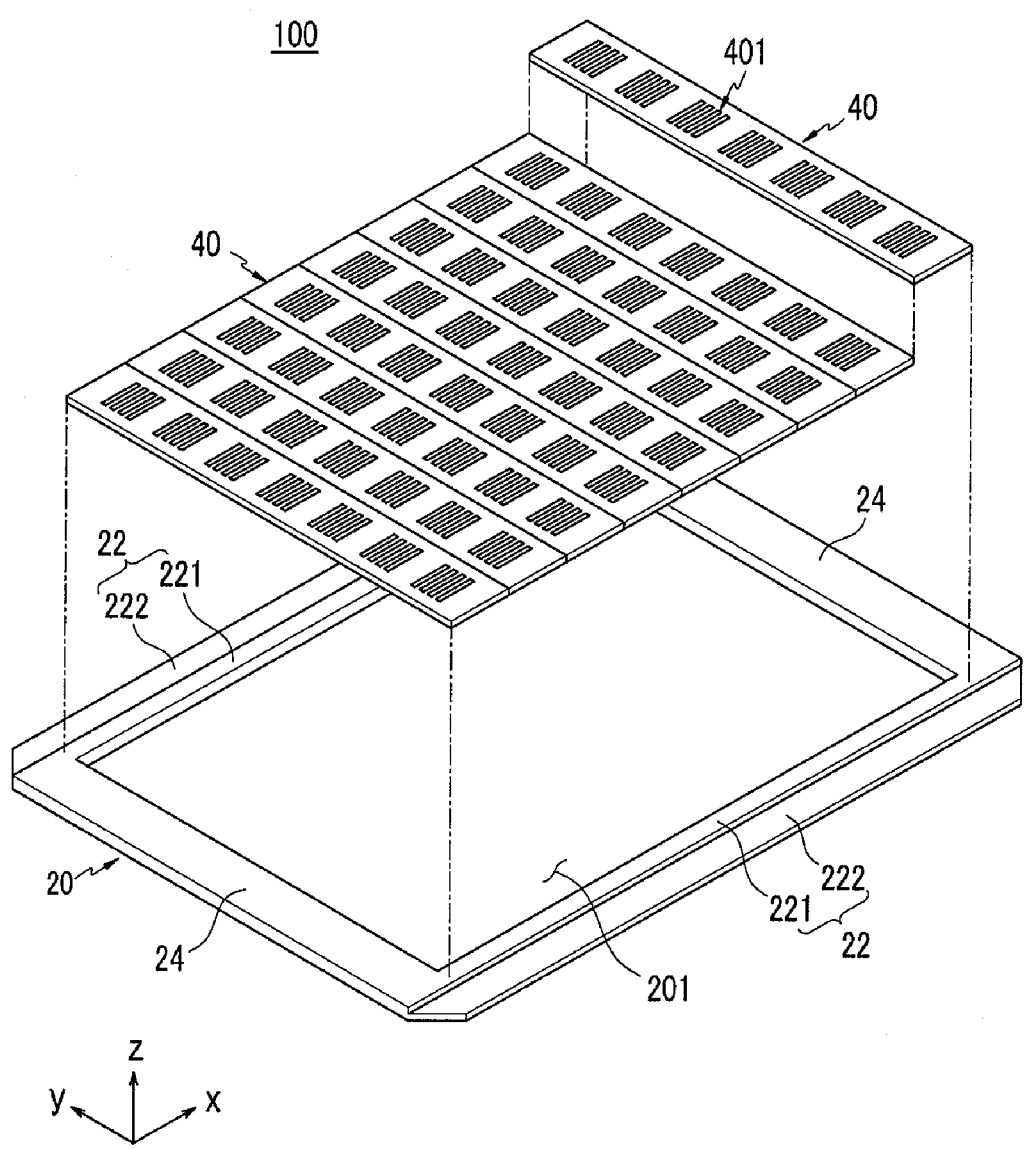
FIG. 1 is an exploded perspective view of a mask assembly for vapor-depositing a thin film of a flat panel display according to an exemplary embodiment of the present invention.
Figure 2:
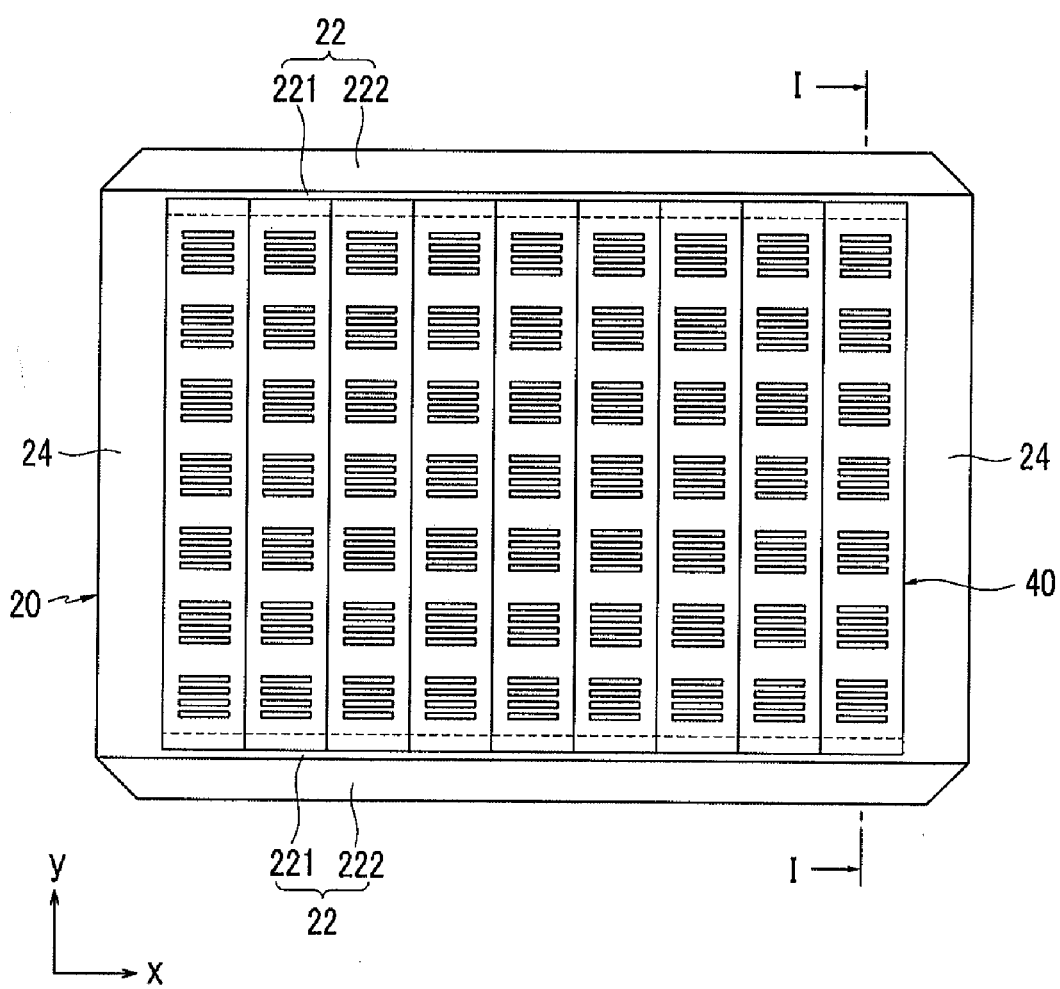
FIG. 2 is a top plan view of the mask assembly for vapor-depositing the thin film of the flat panel display according to the exemplary embodiment of the present invention.
Figure 3:
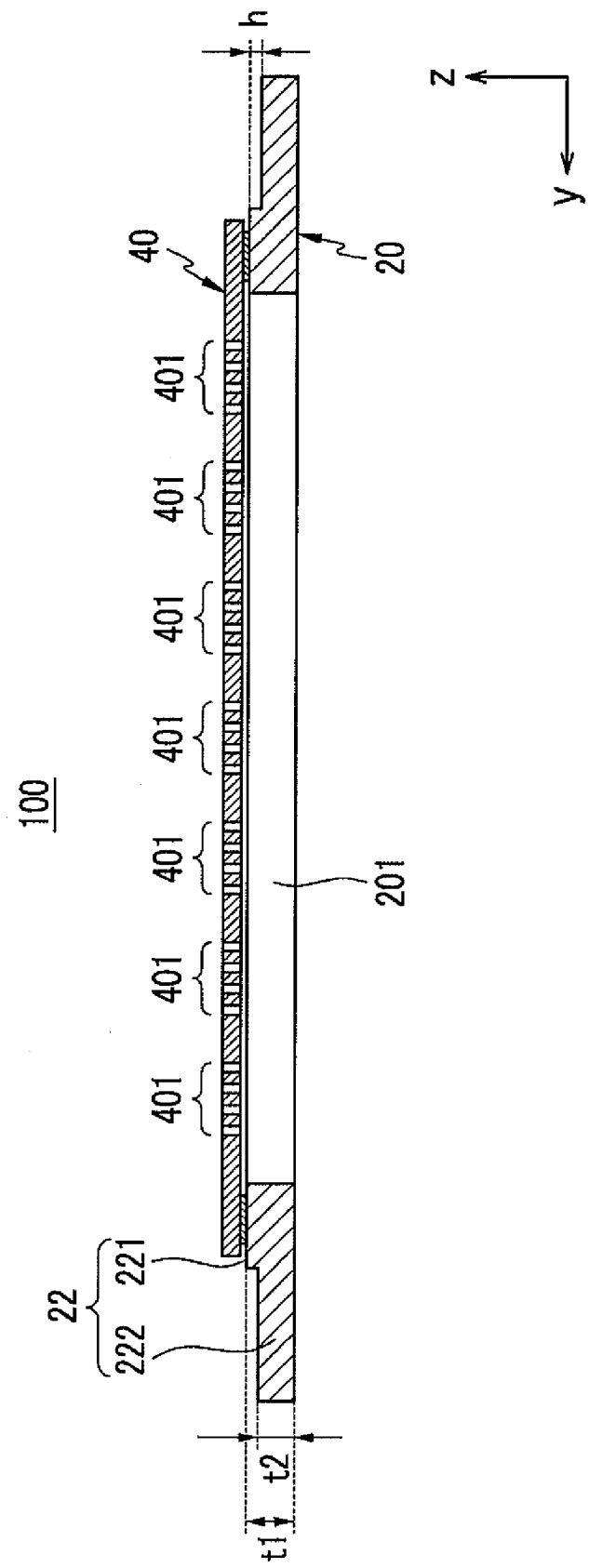
FIG. 3 is a cross-sectional view of the mask assembly taken along a line I-I shown in FIG. 2.

FIG. 1 and FIG. 2 are respectively an exploded perspective view and a top plan view of a mask assembly for vapor-depositing a thin film of a flat panel display according to an exemplary embodiment of the present invention. FIG. 3 is a cross-sectional view of the mask assembly taken along a line I-I shown in FIG. 2.

As shown in FIG. 1 to FIG. 3, a mask assembly 100 includes a frame 20 including an opening 201 and band-shaped unit masks 40 fixed on the frame 20 substantially in parallel while having a tensile force applied thereto along a length direction (i.e., a y axis direction in the FIGs.). The unit masks 40 respectively include a plurality of sets of pattern openings 401 for vapor deposition.

The frame 20 fixes and supports both ends of the unit masks 40, and the pattern openings 401 of the unit masks 40 are exposed through the opening 201. In one embodiment, since a compression force is applied to the frame 20 along the length direction of the unit masks 40 by the tensile force applied to the unit masks 40, a high strength metal material is generally used to form the frame 20 so that the shape of the frame 20 may not be changed by the compression force.

A sheet-shaped mask is divided into the unit masks 40. In the mask assembly 100, unit masks 40 having excellent pattern accuracy are selected from among the unit masks divided from the sheet-shaped mask. Therefore, an error in a shape of the pattern opening 401 used to perform the vapor deposition may be minimized.

In addition, a change of the shape of the unit masks 40 and distortion of the pattern openings 401 that are caused by heat expansion in the vapor deposition process may be suppressed. Further, since a uniform tensile force is applied to the unit masks 40 along the length direction, a change of the shape of a predetermined part of the unit masks 40 may be minimized.

One set of the pattern openings 401 among the plural sets of pattern openings 401 in the unit masks 40 may correspond to one display device. The mask assembly 100 includes the plural sets of pattern openings 401 along the length direction (i.e., the y axis direction in the FIGs.) and a width direction (i.e., an x axis direction in the FIGs.) of the unit masks 40. The pattern openings 401 are respectively formed to be substantially the same as the shapes of a plurality of electrodes or a plurality of emission layers to be formed in the display device. In FIG. 1 to FIG. 3, for convenience of description, the pattern openings 401 are illustrated with a bar shape. Other types of the pattern openings are also possible.

As shown in FIG. 1 to FIG. 3, the frame 20 includes a pair of first supporting portions (or a first pair of side portions) 22 facing each other along the length direction (i.e., the y axis direction in the FIGs.) of the unit masks 40 while having the opening 201 therebetween. The frame 20 also includes a pair of second supporting portions (or a second pair of side portions) 24 facing each other along the width direction (i.e., the x axis direction in the FIGs.) of the unit masks 40 while having the opening 201 therebetween.

The first supporting portions 22 and the second supporting portions 24 may be formed to have substantially the same or different lengths. In FIG. 1 and FIG. 2, for example, the first supporting portion 22 has a length that is longer than the second supporting portion 24 so that the first supporting portion 22 is a longer side of the frame 20 and the second supporting portion 24 is a shorter side of the frame 20.

Here, an upper surface of the first supporting portion 22 on which the unit masks 40 are fixed is formed to have a shape having a predetermined height difference so that an overlapped area of the unit masks 40 and the frame 20 is reduced.

That is, the upper surface of the first supporting portion 22 includes a first surface (or first sub-section) 221 on which the unit masks 40 are fixed and a second surface (or second sub-section) 222 having a height that is lower than that of the first surface 221 along a thickness direction (i.e., a z axis direction in FIG. 1 and FIG. 3) of the unit masks 40 from the first surface 221. In FIG. 3, h denotes the height difference between the first surface 221 and the second surface 222. In one embodiment, the cleansing solution may be drained through the lower second surface 222 while the masks 40 are being cleaned. Further, the height difference between the first and second surfaces may substantially prevent organic materials of the cleansing solution from remaining on the masks 40, or may reduce or minimize the amount of organic materials remaining in the gap.

The first surface 221 is positioned to be closer to the opening 201 than the second surface 222, and is formed to have substantially the same height as the second supporting portion 24. In addition, a lower surface of the first supporting portion 22 is formed to be substantially planar. Accordingly, a thickness t1 (shown in FIG. 3) of the first surface 221 of the first supporting portion 22 is formed to be greater than a thickness t2 of the second surface 222 of the first supporting portion 22.

In one embodiment, the frame 20 having a predetermined thickness is manufactured, and an outer part of the first supporting portion 22 is partially eliminated by, for example, a mechanical process to form the above configuration. Since the height difference h (shown in FIG. 3) between the first surface 221 and the second surface 222 is within about a "several mm" range, it may not actually affect the strength of the frame 20.

Both ends of the unit mask 40 are overlapped with the first surface 221 while the tensile force is applied to the unit mask 40 along the length direction (i.e., the y axis direction in the FIGs.), and the unit masks 40 are fixed on the first surface 221 by, for example, a welding method. In addition, after the unit masks 40 are fixed on the first surface 221, an outer part of a welding point of the unit mask 40 is cut off to form the mask assembly 100.

Since the unit masks 40 are fixed on the first surface 221 having the width that is less than that of the first supporting portion 22, an overlapped area of the unit masks 40 and the frame 20 is reduced to reduce a gap between the unit masks 40 and the frame 20 in the mask assembly 100 according to the exemplary embodiment of the present invention.

Figure 4:
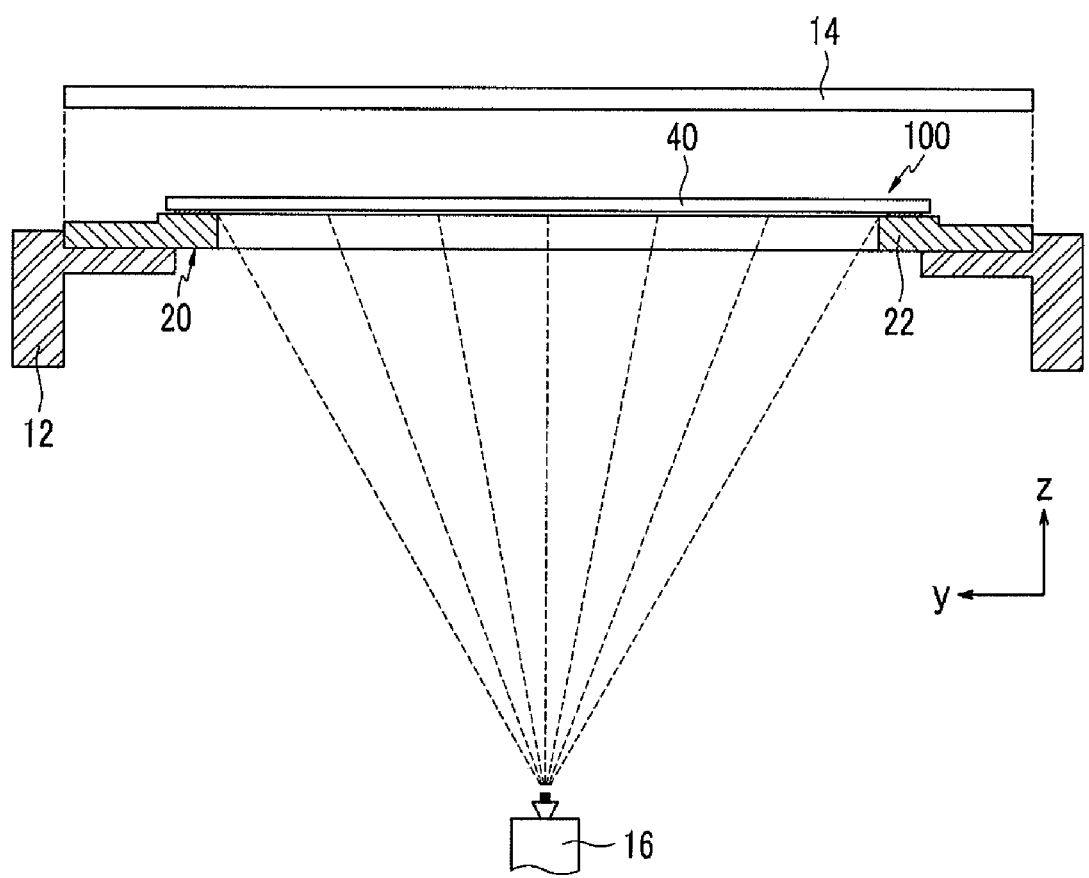
FIG. 4 is a schematic diagram representing a vapor deposition process of the flat panel display by using the mask assembly.

FIG. 4 is a schematic diagram representing a vapor deposition process of the flat panel display using the mask assembly.

As shown in FIG. 4, the mask assembly 100 is fixed on a frame holder 12 in a vapor deposition system, and a mother substrate 14 is provided on the plurality of unit masks 40. In FIG. 4, for convenience of description, the pattern openings formed in the unit mask 40 are not described.

In one embodiment, when electrode materials or emission layer materials are evaporated from a vapor deposition source 16, the materials are deposited on the mother substrate 14 through the pattern openings 401 shown in FIG. 1 in the same shape as the pattern openings 401. As described, a plurality of flat panel displays (e.g., a plurality of OLED displays) may be manufactured on the mother substrate 14 by using the mask assembly 100.

The mask assembly 100 is used to form the plurality of electrodes and the plurality of emission layers of the OLED display, but it is not limited thereto, and the mask assembly 100 may be efficiently used to form electrodes of various other flat panel displays such as LCDs and PDPs.

Figure 5:
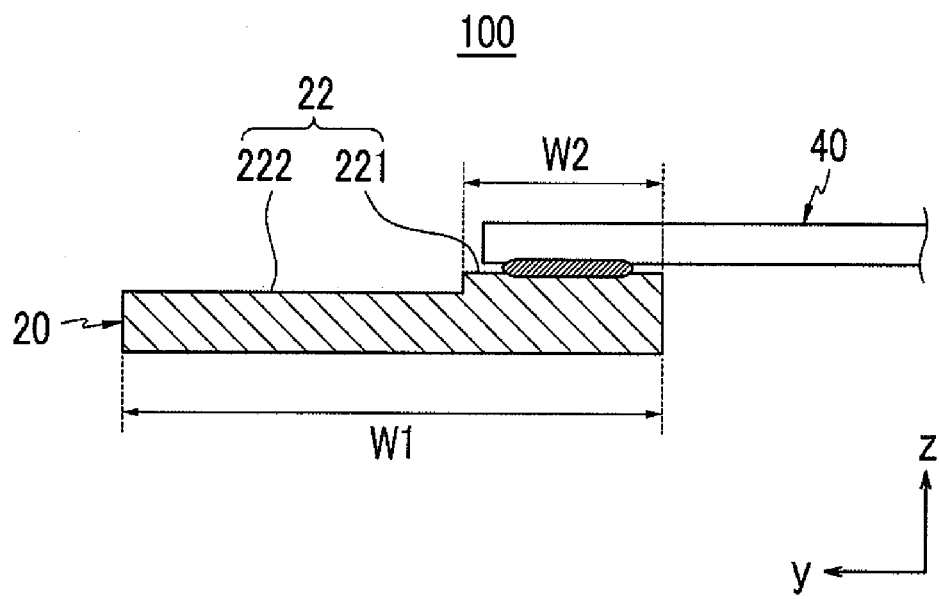
FIG. 5 is a partial enlarged view of the mask assembly shown in FIG. 3.
Figure 6:
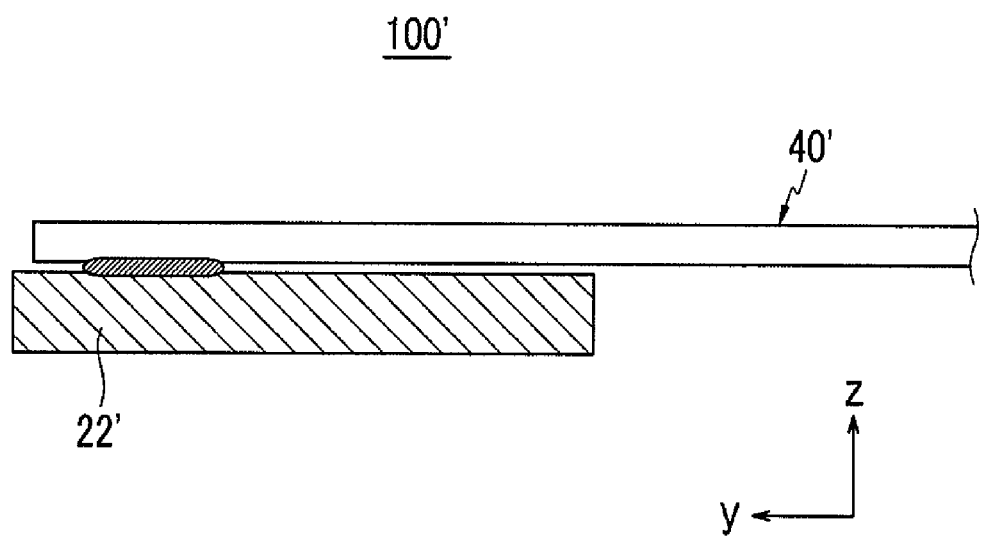
FIG. 6 is a partial enlarged view of a mask assembly according to a comparative example.

FIG. 5 is a partial enlarged view of the mask assembly shown in FIG. 3, and FIG. 6 is a partial enlarged view of a mask assembly according to a comparative example (typical mask assembly).

As shown in FIG. 5, the upper surface of the first supporting portion 22 is divided into the first surface 221 and the second surface 222 in the mask assembly 100. In the FIG. 5 embodiment, only the first surface 221 is connected to and overlaps with the masks 40 when viewed from the thickness direction of the masks. However, in FIG. 6, almost the entire supporting portion 22' is connected to and overlaps with the masks 40. Since the overlapping area is significantly less in the FIG. 5 embodiment than the comparative example of FIG. 6, the mask assembly 100 according to one embodiment of the present invention may efficiently reduce the entire area of the gap between the unit masks 40 and the frame 20 compared to the mask assembly 100' according to the comparative example as shown in FIG. 5.

Accordingly, in the mask assembly 100 according to one embodiment of the present invention, a cleansing solution remaining in the gap between the unit masks 40 and the frame 20 in a process for cleansing organic materials that are vapor-deposited on the mask assembly 100 and drying the mask assembly 100 may be minimized. Furthermore, protrusions and depressions are prevented from being formed on a surface of the unit masks 40 by the cleansing solution.

Therefore, since an adhesive characteristic between the unit masks 40 and the mother substrate 14 shown in FIG. 4 is increased when the mother substrate 14 is disposed on the unit masks 40 to perform the vapor deposition, adhesive precise is increased, the cleansing solution is not leaked in the vapor deposition process, and a vapor deposition error may be prevented.

In one embodiment, a ratio of a width W2 (shown in FIG. 5) of the first surface 221 to a width W1 (shown in FIG. 5) of the first supporting portion 22 may be set to be within a range of about 0.2 to about 0.4, and particularly it may be set to be about 0.3. In another embodiment, depending on required vapor deposition accuracy, the ratio may be less than about 0.2 or greater than about 0.4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask assembly for thin film vapor deposition of a flat panel display, the mask assembly comprising:

a frame comprising a pair of first supporting portions and a pair of second supporting portions, wherein the two pairs are connected to each other so that an inner perimeter of the connected pairs defines an opening; and a plurality of unit masks having at least one set of pattern openings, wherein the unit masks are fixed to the first supporting portion while having a tensile force applied thereto, wherein the plurality of unit masks have a length and a thickness, and wherein the first supporting portion comprises:

a first sub-section connected to a portion of the unit masks, wherein the first sub-section overlaps with the unit mask portion when viewed from the direction of the thickness of the unit masks, and wherein the first sub-section has a first height measured along the thickness direction, and a second sub-section extending from the first sub-section along the direction of the length of the unit masks, wherein the second sub-section is not connected to the unit masks and does not overlap with the unit masks when viewed from the thickness direction, wherein the second sub-section has a second height different from the first height, and wherein the first sub-section has a substantially flat surface which faces the unit masks and is closer to the unit masks than the second sub-section, wherein the first supporting portion satisfies an equation of about $0.2 \leq W2/W1 \leq$ about $0.4$, wherein W1 denotes the width of the first supporting portions and W2 denotes the width of the first sub-section, and wherein the first height is greater than the second height, wherein the first sub-section is welded to the unit masks at a plurality of welded portions, and wherein the length of the welded portions measured along the length direction of the unit masks is greater than about a half of the width (W2) of the first sub-section.

2. The mask assembly of claim 1, wherein the first sub-section is closer to the opening than the second sub-section.

3. The mask assembly of claim 1, wherein each of the first and second sub-sections comprises upper and lower surfaces opposing each other, wherein the upper surface of the first sub-section is connected to the mask portion, and wherein the lower surfaces of the first and second sub-sections together form a substantially flat surface.

4. The mask assembly of claim 1, wherein the first sub-section has substantially the same height as that of the second supporting portions.

5. The mask assembly of claim 1, wherein the frame is configured to receive, through the opening, an organic material evaporated from a vapor deposition source.

6. The mask assembly of claim 1, wherein the first sub-section has a first length measured along the length direction of the unit masks, wherein the second sub-section has a second length measured along the length direction, and wherein the second length is greater than the first length.

7. A mask assembly for thin film vapor deposition of a flat panel display, the mask assembly comprising:

a plurality of unit masks having at least one set of pattern openings; and a frame comprising a first pair of side portions and a second pair of side portions, wherein the first and second pairs are connected to each other so that an inner perimeter of the connected pairs defines an opening, and wherein:

the two pairs of side portions are configured to support the plurality of unit masks;

a majority portion of the unit masks is exposed through the opening of the frame;

each of the first pair of side portions comprises first and second sub-sections having different thicknesses from each other, wherein the second sub-section extends from the first sub-section;

the first sub-section is connected to a portion of the unit masks and overlaps with the mask portion when viewed from the direction of the thickness of the unit masks; and the second sub-section is not connected to the unit masks and does not overlap with the unit masks when viewed from the thickness direction, wherein the first sub-section has a substantially flat surface which faces the unit masks and is closer to the unit masks than the second sub-section, wherein the first supporting portion satisfies an equation of about $0.2 \leq W2/W1 \leq$ about $0.4$, wherein W1 denotes the width of the first supporting portions and W2 denotes the width of the first sub-section, and wherein the thickness of the first sub-section is greater than that of the second sub-section, wherein the first sub-section is welded to the unit masks at a plurality of welded portions, and wherein the length of the welded portions measured along the length direction of the unit masks is greater than about a half of the width (W2) of the first sub-section.

8. The mask assembly of claim 7, wherein the thickness difference is within about a several millimeter range.

9. The mask assembly of claim 7, wherein the first sub-section has a first length measured along the length direction of the unit masks, wherein the second sub-section has a second length measured along the length direction, and wherein the second length is greater than the first length.

10. The mask assembly of claim 7, wherein the frame is configured to receive, through the opening, an organic material evaporated from a vapor deposition source.

* * * * *